United States Patent [19]

Planer et al.

[11] Patent Number: 4,599,672
[45] Date of Patent: Jul. 8, 1986

[54] FAILSAFE POWER-UP/POWER-DOWN SWITCH

[75] Inventors: Norman G. Planer, Annandale, Minn.; Zoltan Zansky, Willowdale, Canada

[73] Assignee: Honeywell Inc., Minneapolis, Minn.

[21] Appl. No.: 632,788

[22] Filed: Jul. 20, 1984

[51] Int. Cl.$^4$ .............................................. H02H 3/24
[52] U.S. Cl. .................................... 361/92; 361/91; 307/296 R
[58] Field of Search ............ 307/296 R, 318; 361/91, 361/92

[56] References Cited

U.S. PATENT DOCUMENTS

| | | | |
|---|---|---|---|
| 3,043,966 | 7/1962 | Norman | 307/318 |
| 3,624,617 | 11/1971 | Elizabeth et al. | 361/92 X |
| 3,703,648 | 12/1972 | Wrabel | 307/318 X |
| 3,757,302 | 9/1973 | Pollitt | 361/92 X |
| 3,918,043 | 12/1975 | Beck | 361/92 X |
| 3,969,635 | 7/1976 | Wilke | 361/92 X |
| 4,266,145 | 5/1981 | Amacher et al. | 307/296 R X |
| 4,428,020 | 1/1984 | Blanchard | 361/90 |
| 4,446,499 | 5/1984 | Kishimoto et al. | 361/92 |
| 4,473,759 | 9/1984 | Mahabadi | 307/296 R X |
| 4,493,000 | 1/1985 | Edwards | 361/92 |
| 4,536,667 | 8/1985 | Masuda | 307/296 R X |

Primary Examiner—A. D. Pellinen
Assistant Examiner—A. Jonathan Wysocki
Attorney, Agent, or Firm—Charles G. Mersereau

[57] ABSTRACT

A power-up/power-down safety switch includes a simple, low-cost circuit having one AND gate, which may be a CMOS IC, one voltage-limiting diode and three resistors. The circuit functions in conjunction with a logic control circuit in a manner which assures that the inhibiting voltage to the logic control circuit $V_{INH}$ is equal to (or slightly less than) the supply voltage, $V_{CC}(t)$, until $V_{CC}(t)$ reaches the minimum required supply voltage for the circuit logic to operate properly. $V_{INH}$ is then rapidly switched to a low state such that the circuit logic operates without interference. Conversely, when the circuit is turned OFF, the value of $V_{INH}$ is switched to a high state as soon as the supply voltage reaches the minimum value to operate the logic circuit thereby again causing the logic outputs to go low and that all the drive signals to the power switch are in the OFF state.

7 Claims, 5 Drawing Figures

FAILSAFE POWER-UP/POWER-DOWN SWITCH

BACKGROUND OF THE INVENTION

The present invention relates generally to a protective switch which prevents damage to components in an electronic switching power converter and, more particularly, to a failsafe power-up/power-down switch which assures that the logic controlling the switching of bipolar power transistors passes through a known sequence of states upon energizing or de-energizing of the power source.

It is important to have logic in a complex system pass through a known sequence of states when the circuits are energized or de-energized from a power source. This not only insures proper start up operation of the circuit, but also prevents the occurence of potentially destructive states insofar as the circuit components are concerned. Thus, it is desirable to guarantee the system logic remains in a benign state until it is fully energized and ready for operation or until it is fully de-energized.

In the case of an electronic switching power converter, such as a brushless DC motor drive, having series connected bipolar power transistors between a high voltage DC source and ground, it is very important that both switches, and therefore both bipolar power transistors, not be turned on simultaneously. The critical time at which such a phenomenon can occur is during power-up or power-down of such devices; so there exists a definite need to assure that such a condition does not occur.

SUMMARY OF THE INVENTION

By means of the present invention there is provided a failsafe switch which assures that all switches in a switching power converter controlling series connected bipolar power transistor are positively controlled to the OFF state until the logic power supply has brought all logic devices up past their minimum required supply voltages such that the system is ready for operation; or, conversely, turns such switches off until the system is fully de-energized to prevent undesireable phenomena from occurring when the power is turned off. The failsafe switch of the present invention operates on the inhibit input of a logic decoder integrated circuit (IC), or the like, the output of which controls the switching of bipolar power transistors of an electronic switching power converter.

On start up, it operates in a manner that assures that all of the logic signal outputs from the logic decoder, and therefore, the drive signals to the power switches are in the inhibited or the OFF state until all the other logic is in the desired defined initial state to begin operation of the controlled circuit. During operation of the control circuit, the switch does not interfere with the normal operation of the decoder circuit. During power-down, the failsafe switch again controls the logic signal outputs from the logic decoder such that the drive signals to the power switches are again in the OFF state.

In the preferred embodiment, the power-up/power-down safety switch of the invention is a simple, low cost circuit consisting of one AND gate, which may be a CMOS IC, one Zener diode and three resistors. The switch circuit functions in a manner to assure that the inhibiting voltage $V_{INH}$ is equal to (or slightly less than) the supply voltage, $V_{CC}(t)$, until $V_{CC}(t)$ reaches the minimum required supply voltage for the circuit logic to operate properly. $V_{INH}$ is then monotonically and rapidly switched to a low state such that the circuit logic operates without interference. Conversely, when the circuit is turned off, the value of $V_{INH}$ is switched to a high state as soon as the supply voltage reaches the minimum value to operate the logic circuit thereby again causing the logic outputs to go low and that all the drive signals to the power switch are in the OFF state.

DESCRIPTION OF THE PREFERRED EMBODIMENT

Figure 1:
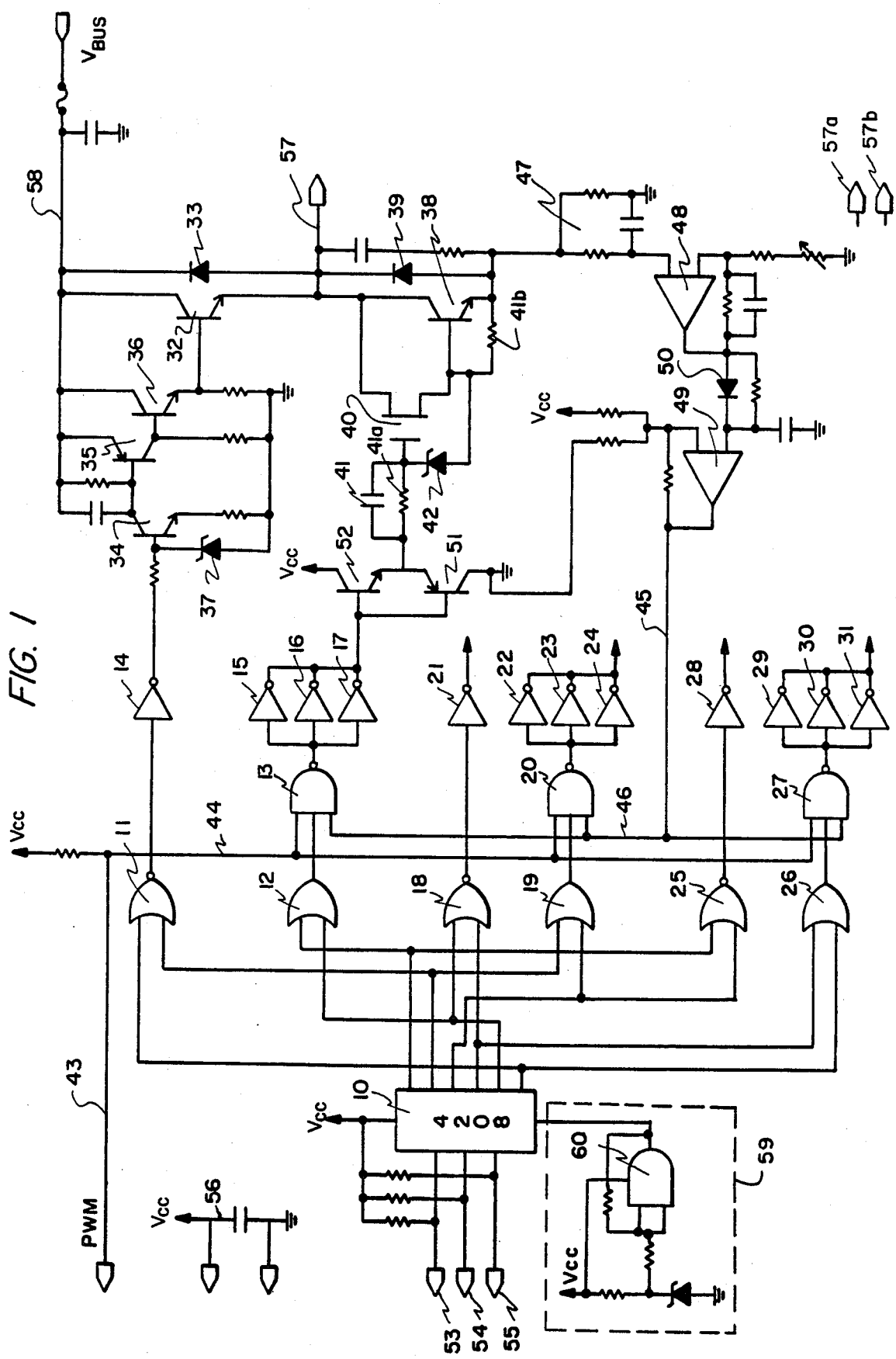
FIG. 1 is a schematic circuit diagram of a three-phase brushless DC motor drive including the failsafe power-up/power-down switch of the invention.

FIG. 1 shows a schematic circuit drawing of a basic circuit used in a three-phase DC brushless motor drive which includes the power-up/power-down logic switch of the present invention. The circuit is generally conventional and includes a decoder or three-bit binary to octal converter IC 10, which may be a Motorola 4028 IC, or the like. Outputs from the IC are connected to NOR gate 11 and OR gate 12 and these together with NAND gate 13 and inverters 14 through 17 provide the switching logic for one phase of the three-phase drive system. Similarly, NOR gate 18, OR gate 19, NAND gate 20 and inverters 21 through 24 and NOR gate 25, OR gate 26, NAND gate 27 and inverters 28 through 31 provide the switching logic for the other two phases. The switching circuits and associated bipolar power transistors are illustrated for but one of these phases inasmuch as the other two are identical.

Each phase includes an upper or unmodulated switching power transistor as at 32 with associated parallel diode 33. The power transistor 32 is turned on and off by a switching circuit including transistors 34, 35 and 36 together with Zener diode 37. A lower, PWM-modulated bipolar switching power transistor 38 with an associated parallel diode 39 is provided. The transistor 38 is switched by a very fast unique FET-Bipolar-Darlington switch which includes FET 40, capacitor 41, resistors 41a and 41b and Zener diode 42. This switch enables the power transistor to be turned on and off very rapidly by allowing it to rapidly charge and discharge capacitor 41 through Zener diode 42. The FET-Bipolar-Darlington switch itself is the subject of a separate patent application Ser. No. 632,578 filed of even date and assigned to the same assignee as the present application.

The switching circuit associated with the bipolar power transistor 32 operates in response to the logic signal output of inverter 14. The control or operating circuit associated with the bipolar power transistor 38 includes a pulse width modulated (PWM) high frequency speed control input signal on line 43 which connects to one input of the NAND gates including gate 13 via line 44. A further signal to another input of the NAND gates including gate 13 on lines 45 and 46 is supplied from a current limiting circuit which includes current sensing circuit 47 with amplifiers 48 and 49 and diode 50. The signal is pulse modulated by the output of the emitter of transistors 51 and 52 in association with inverters 15 through 17 operate the FET-Bipolar-Darlington switch. Other logic input from Hall effect sensors on lines 53 through 55 are located 120° apart and sense the position of the motor armature in a well known manner. A DC power supply is depicted at 56.

As can be seen from the above, the output to the motor at 57 operates basically as a three-phase, bridge inverter. Of course, 57 indicates the output to one phase of the motor and additional, identical outputs for the other, partially depicted phases, is shown at 57a and 57b.

Figure 3:
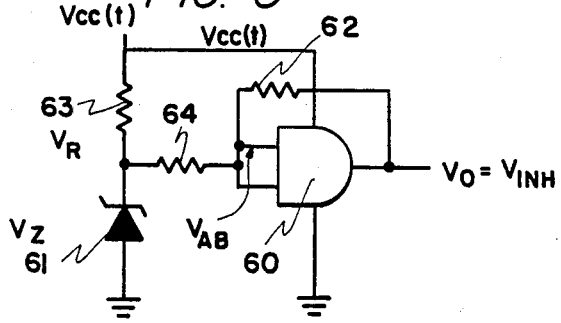
FIG. 3 is an enlarged view of the failsafe power-up/power-down logic switch of the invention.

The failsafe power-up/power-down logic switch of the invention enclosed by the broken line 59 is connected to the inhibit pin of the IC 10 and the circuit of FIG. 1. This is shown in larger detail in FIG. 3. The switch includes AND gate 60, Zener diode 61, feedback resistor 62 and resistors 63 and 64. The AND gate 60 may be any AND gate suitable for the particular application and in one embodiment of FIG. 1 a CMOS 4071B AND gate was used.

Figure 2:
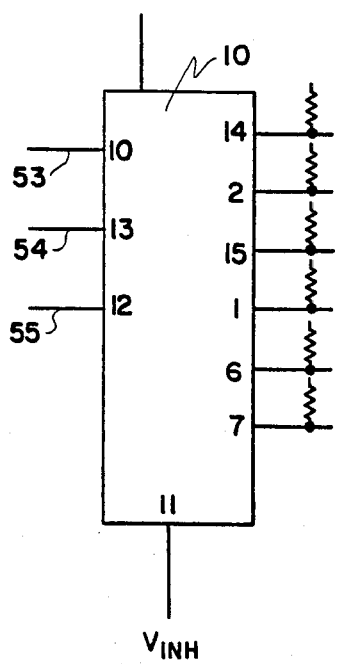
FIG. 2 is an enlarged view of the decoder of FIG. 1.

The outputs on the right side of the decoder 10 (FIG. 2) will be in the OFF or "low" state as long as the inhibiting voltage, $V_{INH}$, applied to pin 11 of the IC is greater than the supply voltage, $V_{CC}(t)$, less an amount $V_{TOL}$, where $V_{TOL} \cong 1$ V. On power-up the switching circuit of the present invention functions to assure that $V_{INH}$ is equal to or slightly less than $V_{CC}(t)$ until $V_{CC}(t)$ reaches the minimum required voltage to properly operate the circuit logic which is just above $V_{ABH}$ which is the voltage required to switch the logic from an OFF or "low" state to an ON or "high" state, $V_{INH}$ is then rapidly switched to a "low" state for proper logic circuit operation. As can be seen in FIG. 1, this causes all the drive signals to the power transistor switches to be initially in the "low" or OFF state.

Figure 4:
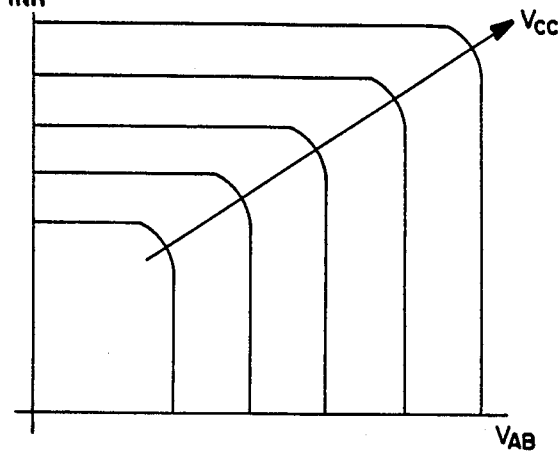
FIG. 4 is a graph showing the relationship between the voltages of the switch of FIG. 3.
Figure 5:
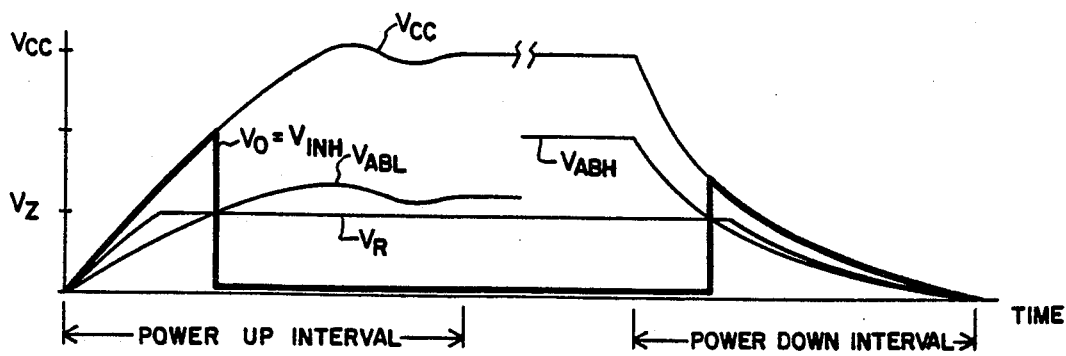
FIG. 5 is another graph depicting the operation of the switch of FIG. 3.

The relationship of $V_{CC}$, $V_{ABH}$ and the power-up/power-down switch output voltage $V_O$ which is, of course, $V_{INH}$ is shown in FIG. 4. A diagram of the operation of the switch is shown in FIG. 5. $V_Z$ is the Zener voltage and $V_{ABL}$ is the maximum "low" or OFF state voltage.

As shown in FIGS. 4 and 5, as $V_{CC}(t)$ rises from zero upon turn-on, $V_R$ rises along with it until $V_R = V_Z$. Up to that point, $V_R$ follows $V_{CC}$ and $V_O$. As $V_{CC}(t)$ increases above $V_Z$ the Zener diode 61 holds $V_R$ constant at $V_Z$, but $V_O$ and $V_{ABL}$ continue to increase with $V_{CC}(t)$ until $V_R$ is actually less than the maximum "low" or OFF state voltage $V_{ABL}$ ($V_R < V_{ABL}$). At this point, the gate 60 enters a transition region where it may become unstable and oscillate between the "high and "low" state if the $V_{CC}(t)$ does not cross the transition region near $V_R$ fast enough. Resistors 62 and 64 are selected to provide enough hysteresis to assure a fast transition and no oscillation. From the transition point on, $V_O$ is switched to the OFF or "low" state and does not inhibit the normal operation of the logic. During power-down, as $V_{CC}(t)$ decreases, $V_O$ remains in the "low" state until $V_R$ becomes greater than the minimum "high" or ON state voltage $V_{ABH}$ (or $V_R > V_{ABH}$). Then again because of resistor 62 the circuit regeneratively turns ON and $V_O$ goes to the ON or "high" state ($V_O = V_{CC}(t)$) and follows $V_{CC}(t)$ to zero.

In this manner the motor drive circuit components of FIG. 1 are protected from any surges due to erratic logic output start up or shut down of the brushless motor drive. This is especially true in preventing upper and lower transistors 32 and 38 from simultaneously turning on.

The present invention, then, provides a simple low cost failsafe switch which uses switch points that are a function of the supply voltage in a manner which simplifies the power-up or power-down control logic required.

The embodiments of the invention in which an exclusive property or right is claimed are defined as follows:

1. A power-up/power-down logic control switch for use with a logic control circuit comprising:
   a source of power supply voltage;
   logic circuit means having a power supply input and first and second logic inputs and an output, wherein said power supply input is connected to said source of power supply voltage and said first and second logic inputs are common inputs connected through resistance to a source of logic supply voltage and to said output via a feedback resistor, and wherein said logic circuit means is further characterized by having a minimum input threshold voltage and a maximum input threshold voltage which vary with said power supply input during power-up and power-down of said power supply voltage and function in a manner such that when said source of power supply voltage is turned on, as long as said first and second logic inputs exceed the minimum threshold, the output will be in its maximum value or higher state, and when the value of said first and second logic inputs fall below the minimum input threshold, the output will switch to its minimum value, and when said source of logic supply voltge is turned off, said output of said logic circuit means will switch to its maximum value when said maximum input threshold drops below the voltage of said first and second logic inputs;
   a voltage-limiting circuit means connected between ground and said first and second logic inputs thereby limiting the maximum value of said first and second logic inputs; and
   wherein the output of said logic circuit means is connected to the inhibit input of a logic control circuit.

2. The logic control switch of claim 1 further comprising resistance means connected between said voltage limiting circuit means and said first and second logic inputs.

3. The logic control switch of claim 1 wherein said logic circuit means is an AND gate.

4. The logic control switch of claim 2 wherein said logic circuit means is an AND gate.

5. The logic control switch of claim 1 wherein said voltage-limiting circuit comprises a Zener diode.

6. The logic control switch of claim 2 wherein said voltage-limiting circuit comprises a Zener diode.

7. The logic control switch of claim 3 wherein said voltage-limiting circuit comprises a Zener diode.

* * * * *